(12) United States Patent
Yang et al.

(10) Patent No.: US 9,721,958 B2
(45) Date of Patent: Aug. 1, 2017

(54) METHOD OF FORMING SELF-ALIGNED SPLIT-GATE MEMORY CELL ARRAY WITH METAL GATES AND LOGIC DEVICES

(71) Applicant: Silicon Storage Technology, Inc., San Jose, CA (US)

(72) Inventors: Jeng-Wei Yang, Zhubei (TW); Chun-Ming Chen, New Taipei (TW); Man-Tang Wu, Xinpu Township, Hsinchu County (TW); Feng Zhou, Fremont, CA (US); Xian Liu, Sunnyvale, CA (US); Chien-Sheng Su, Saratoga, CA (US); Nhan Do, Saratoga, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/003,659

(22) Filed: Jan. 21, 2016

(65) Prior Publication Data
US 2016/0218110 A1    Jul. 28, 2016

Related U.S. Application Data

(60) Provisional application No. 62/107,077, filed on Jan. 23, 2015.

(51) Int. Cl.
*H01L 21/336*    (2006.01)
*H01L 27/11524*    (2017.01)
(Continued)

(52) U.S. Cl.
CPC .. *H01L 27/11524* (2013.01); *H01L 21/28273* (2013.01); *H01L 21/30604* (2013.01);
(Continued)

(58) Field of Classification Search
USPC ......................................................... 438/266
See application file for complete search history.

(56) References Cited

U.S. PATENT DOCUMENTS

| 7,390,718 B2 | 6/2008 | Roizin |
| 7,439,133 B2 | 10/2008 | Chou |

(Continued)

FOREIGN PATENT DOCUMENTS

| TW | 200723543 | 6/2007 |
| TW | 201338101 | 9/2013 |

OTHER PUBLICATIONS

U.S. Appl. No. 15/002,307, filed Jan. 2016, Wu, et al.

*Primary Examiner* — Timor Karimy
(74) *Attorney, Agent, or Firm* — DLA Piper LLP (US)

(57) ABSTRACT

A method of forming a memory device by forming spaced apart first and second regions with a channel region therebetween, forming a floating gate over and insulated from a first portion of the channel region, forming a control gate over and insulated from the floating gate, forming an erase gate over and insulated from the first region, and forming a select gate over and insulated from a second portion of the channel region. Forming of the floating gate includes forming a first insulation layer on the substrate, forming a first conductive layer on the first insulation layer, and performing two separate etches to form first and second trenches through the first conductive layer. A sidewall of the first conductive layer at the first trench has a negative slope and a sidewall of the first conductive layer at the second trench is vertical.

13 Claims, 27 Drawing Sheets

(51) Int. Cl.
  *H01L 21/28*      (2006.01)
  *H01L 29/423*     (2006.01)
  *H01L 29/66*      (2006.01)
  *H01L 29/788*     (2006.01)
  *H01L 27/11536*   (2017.01)
  *H01L 21/306*     (2006.01)

(52) U.S. Cl.
  CPC .. *H01L 27/11536* (2013.01); *H01L 29/42328* (2013.01); *H01L 29/66545* (2013.01); *H01L 29/66825* (2013.01); *H01L 29/7881* (2013.01)

(56) References Cited

U.S. PATENT DOCUMENTS

| | | | |
|---|---|---|---|
| 7,868,375 B2 | 1/2011 | Liu et al. | |
| 8,173,514 B2 | 5/2012 | Ogura | |
| 9,082,865 B2 | 7/2015 | Yu | |
| 9,214,354 B2 | 12/2015 | Ishida | |
| 9,219,134 B2 | 12/2015 | Fukumoto | |
| 9,224,745 B2 | 12/2015 | Torii | |
| 9,230,977 B2 | 1/2016 | Wu | |
| 9,269,766 B2 | 2/2016 | Wu | |
| 9,412,599 B2 | 8/2016 | Ishida | |
| 9,412,755 B2 | 8/2016 | Ishida | |
| 2005/0186741 A1 | 8/2005 | Roizin | |
| 2009/0039410 A1 | 2/2009 | Liu | |
| 2009/0215243 A1 | 8/2009 | Ogura | |
| 2010/0054043 A1 | 3/2010 | Liu | |
| 2012/0299056 A1 | 11/2012 | Arai | |
| 2013/0171814 A1 | 7/2013 | Torii | |
| 2013/0242659 A1 | 9/2013 | Yu | |
| 2015/0084111 A1 | 3/2015 | Wu | |
| 2015/0171101 A1 | 6/2015 | Ishida | |
| 2015/0171102 A1 | 6/2015 | Ishida | |
| 2015/0171103 A1 | 6/2015 | Ishida | |
| 2016/0043095 A1 | 2/2016 | Yang | |
| 2016/0126327 A1 | 5/2016 | Chen | |
| 2016/0148944 A1 | 5/2016 | Yu | |
| 2016/0163722 A1 | 6/2016 | Chang | |
| 2016/0181266 A1 | 6/2016 | Chuang | |
| 2016/0218110 A1 | 7/2016 | Yang | |

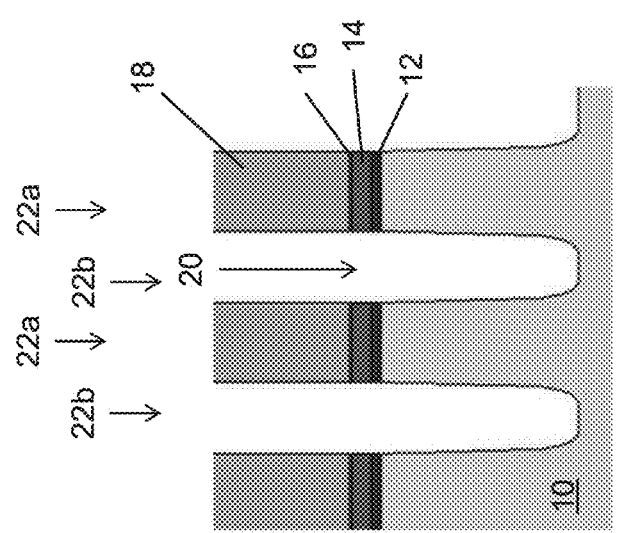
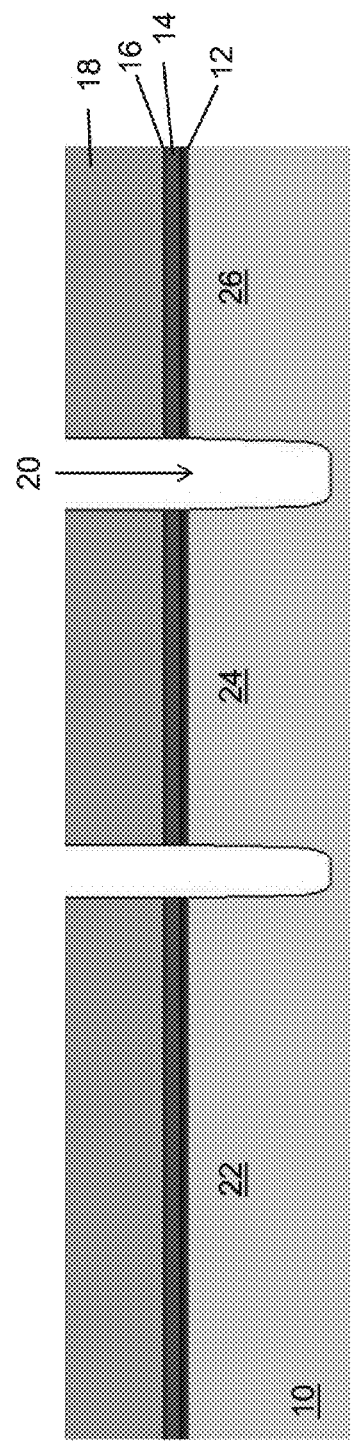

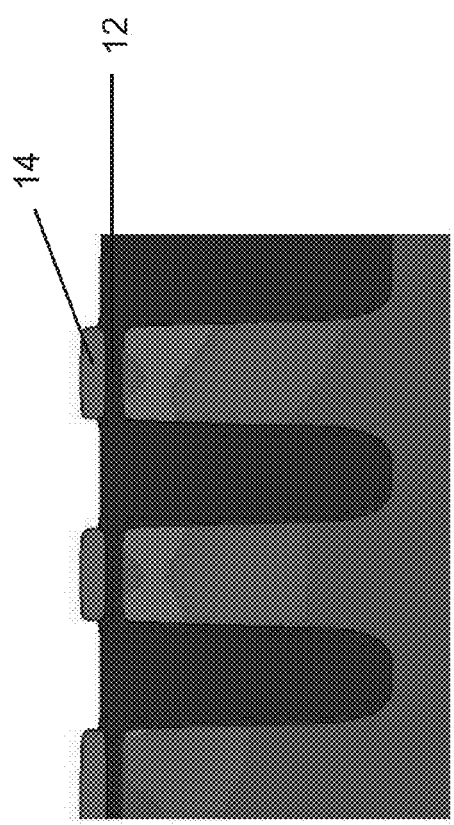
FIG. 3A
FIG. 3B

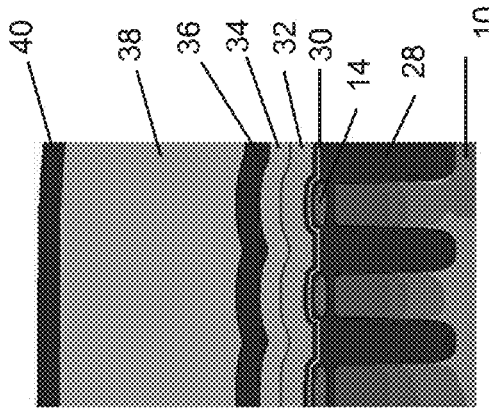
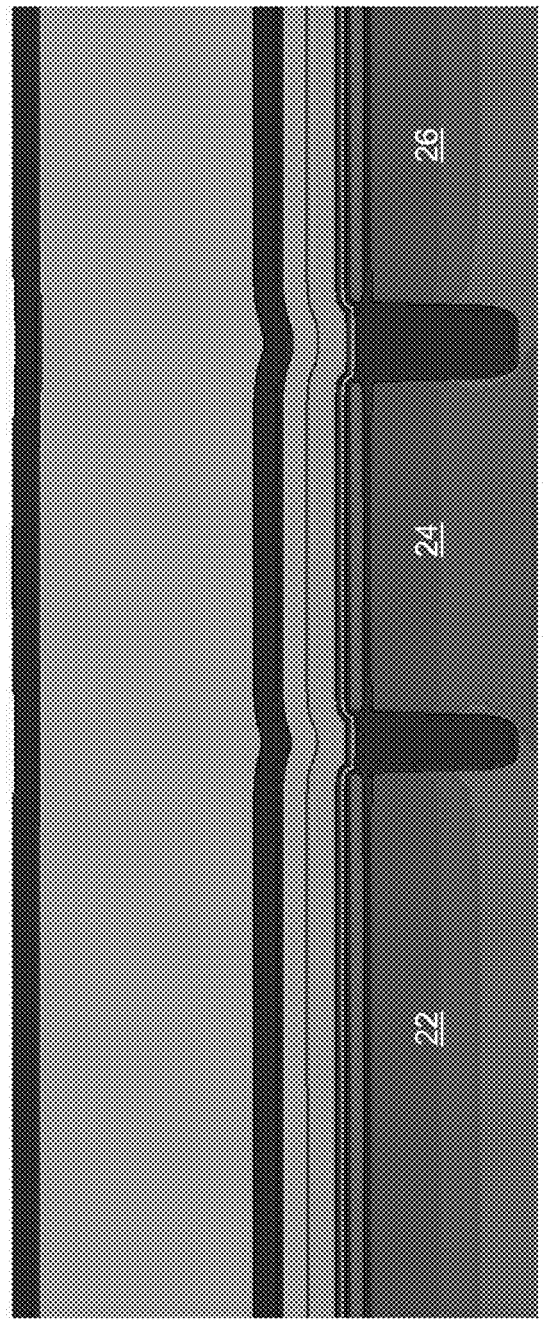
FIG. 4A
FIG. 4B

METHOD OF FORMING SELF-ALIGNED SPLIT-GATE MEMORY CELL ARRAY WITH METAL GATES AND LOGIC DEVICES

RELATED APPLICATIONS

This application claims the benefit of U.S. Provisional Application No. 62/107,077, filed Jan. 23, 2015.

FIELD OF THE INVENTION

The present invention relates to non-volatile memory cell arrays.

BACKGROUND OF THE INVENTION

It is well known in the art to form split-gate memory cells as an array of such cells. For example, U.S. Pat. No. 7,868,375 (incorporated herein by reference for all purposes) discloses an array of memory cells, where each memory cell includes a floating gate, a control or coupling gate, a select gate, an erase gate, all formed on a substrate with a channel region defined between a source and drain regions. For efficient use of space, the memory cells are formed in pairs, with each pair sharing a common source region and erase gate.

It is also known to form both low voltage and high voltage logic devices on the same wafer die as the array of memory cells. Such logic devices can include transistors each having a source and drain, and a poly gate controlling the conductivity of the channel region between the source and drain.

BRIEF SUMMARY OF THE INVENTION

A method of forming a memory device including forming, in a substrate of a first conductivity type, spaced apart first and second regions of a second conductivity type, defining a channel region therebetween, forming a floating gate disposed over and insulated from a first portion of the channel region which is adjacent the first region, forming a control gate disposed over and insulated from the floating gate, forming an erase gate disposed over and insulated from the first region, and forming a select gate over and insulated from a second portion of the channel region which is adjacent to the second region. The forming of the floating gate includes forming a first insulation layer on the substrate, forming a first conductive layer on the first insulation layer, performing a first etch to form a first trench through the first conductive layer, and performing a second etch different than the first etch to form a second trench through the first conductive layer. The floating gate constitutes the first conductive layer between the first and second trenches. The first region is disposed under the first trench. A sidewall of the first conductive layer at the first trench has a negative slope, and a sidewall of the first conductive layer at the second trench is vertical.

A method of forming a memory device includes forming, in a substrate of a first conductivity type, spaced apart first and second regions of a second conductivity type, defining a channel region therebetween, forming a floating gate disposed over and insulated from a first portion of the channel region which is adjacent the first region, forming a control gate disposed over and insulated from the floating gate, forming an erase gate disposed over and insulated from the first region, and forming a select gate over and insulated from a second portion of the channel region which is adjacent to the second region. The forming of the floating gate includes depositing a first polysilicon layer over and insulated from the substrate, and etching through the first polysilicon layer leaving a block of the first polysilicon layer that constitutes the floating gate. The forming of the control gate includes depositing a second polysilicon layer over and insulated from the first polysilicon layer, and etching through the second polysilicon layer leaving a block of the second polysilicon layer that constitutes the control gate. The forming of the erase gate includes depositing a third polysilicon layer over and insulated from the first region. The forming of the select gate includes depositing a fourth polysilicon layer over and insulated from the substrate, and etching through the fourth polysilicon layer leaving a first block of the fourth polysilicon layer laterally adjacent to and insulated from the floating gate and the control gate.

Other objects and features of the present invention will become apparent by a review of the specification, claims and appended figures.

BRIEF DESCRIPTION OF THE DRAWINGS

FIGS. 1A to 7A are side cross sectional views (in the cell WL direction in the memory area) showing the steps in forming the memory cell device of the present invention.

FIGS. 1B to 7B are side cross sectional views (in the cell BL direction) showing the steps in forming the memory cell device of the present invention.

DETAILED DESCRIPTION OF THE INVENTION

Figure 2A:
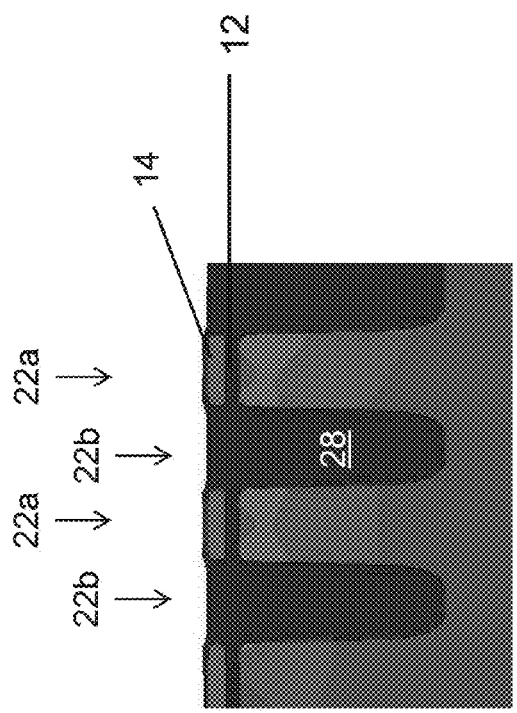

The present invention is a technique for forming self-aligned split-gate memory cells with metal gates, and both low and high voltage logic devices on the same wafer die as the memory cell array.

The process begins by providing a semiconductor substrate 10. An oxide layer 12 is formed on the substrate 10. A first polysilicon (poly) layer 14 is formed on the oxide layer 12. A nitride layer 16 is formed on the poly layer 14. The nitride layer 16 can include a BARC coating thereon. The structure is patterned using a photolithography photo resist deposition 18, mask exposure and photo resist etch. BARC, nitride, poly, oxide and silicon etches are performed on the exposed portions of the structure to form trenches 20 extending through all these layers and into the substrate 10. The trenches 20 divide the substrate into one or more memory cell areas 22, one or more HV/MV device areas 24, and one or more core device areas 26, and divide the memory cell area 22 into active regions 22a and isolation regions 22b. The resulting structure is shown in FIG. 1A (cross section in the cell WL direction, in the memory area 22) and FIG. 1B (cross section in the cell BL direction).

Figure 2B:
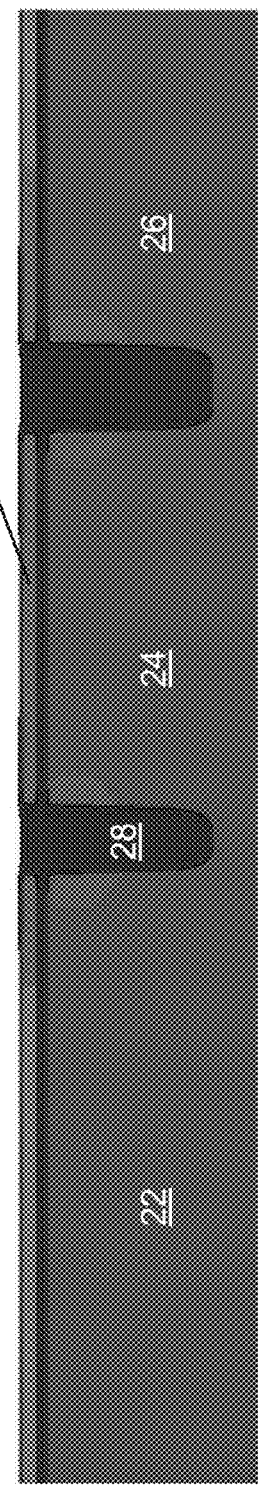

After photo resist 18 is removed, the trenches 20 are filled with insulation material (e.g. STI oxide). Preferably, this involves a conventional STI process where the trenches are lined with an oxide layer, followed by oxide deposition, anneal and CMP (chemical mechanical polish) oxide etch. The nitride layer 16 is then removed by a nitride etch. The resulting structure is shown in FIGS. 2A and 2B.

Preferably, a poly implant is performed on the exposed poly layer 14. Then, an oxide etch is used to lower the upper surface of the STI insulation 28 below that of the poly layer 14, as shown in FIGS. 3A and 3B.

An ONO (oxide, nitride, oxide) insulation 30 is formed over the structure by oxide, nitride, oxide deposition and anneal. A second poly layer 32 is formed over the structure, followed by a poly implant and anneal. Next, a nitride layer 34 is formed on the structure, followed by an oxide layer 36, followed by another nitride layer 38, followed by another oxide layer 40, as shown in FIGS. 4A and 4B.

Figure 5A:
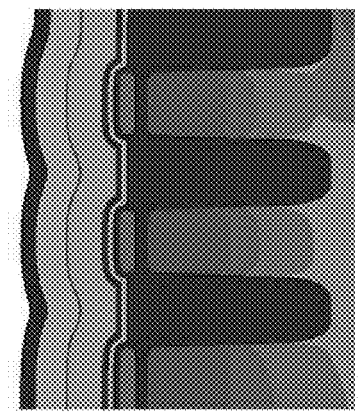
Figure 5B:
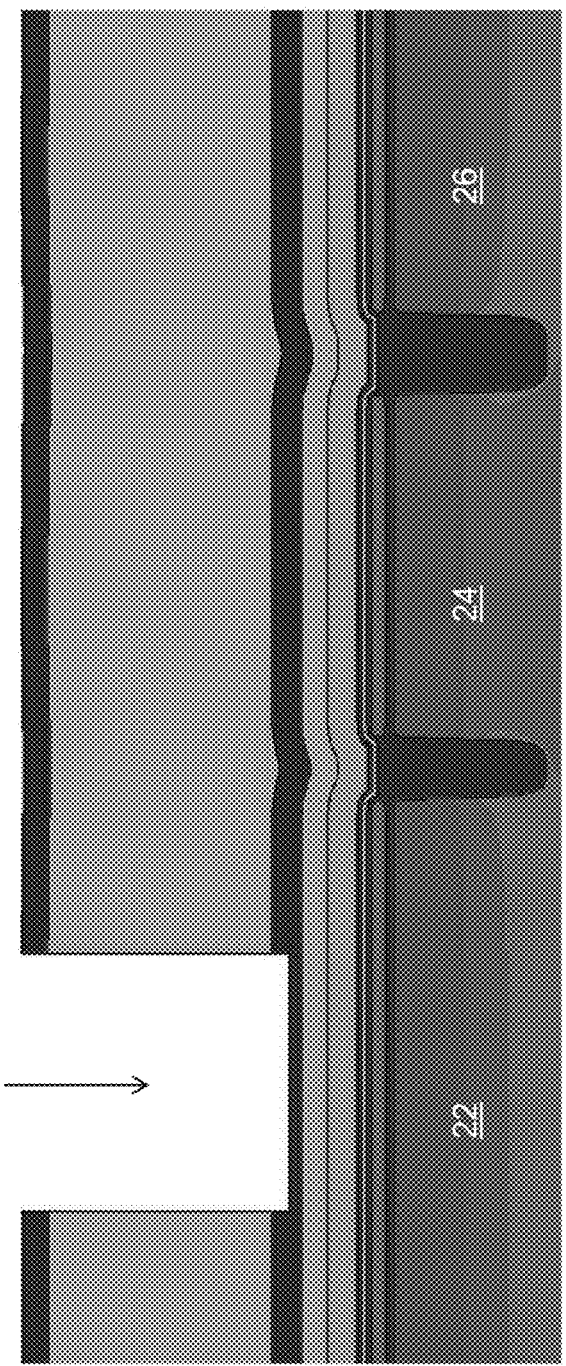
Figure 6A:
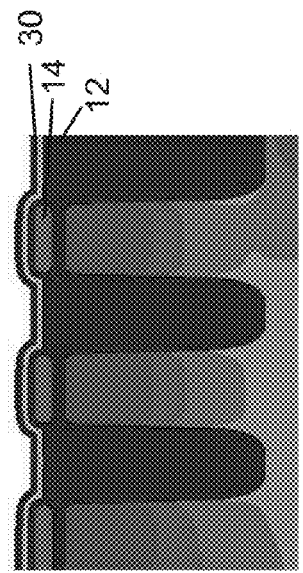
Figure 6B:
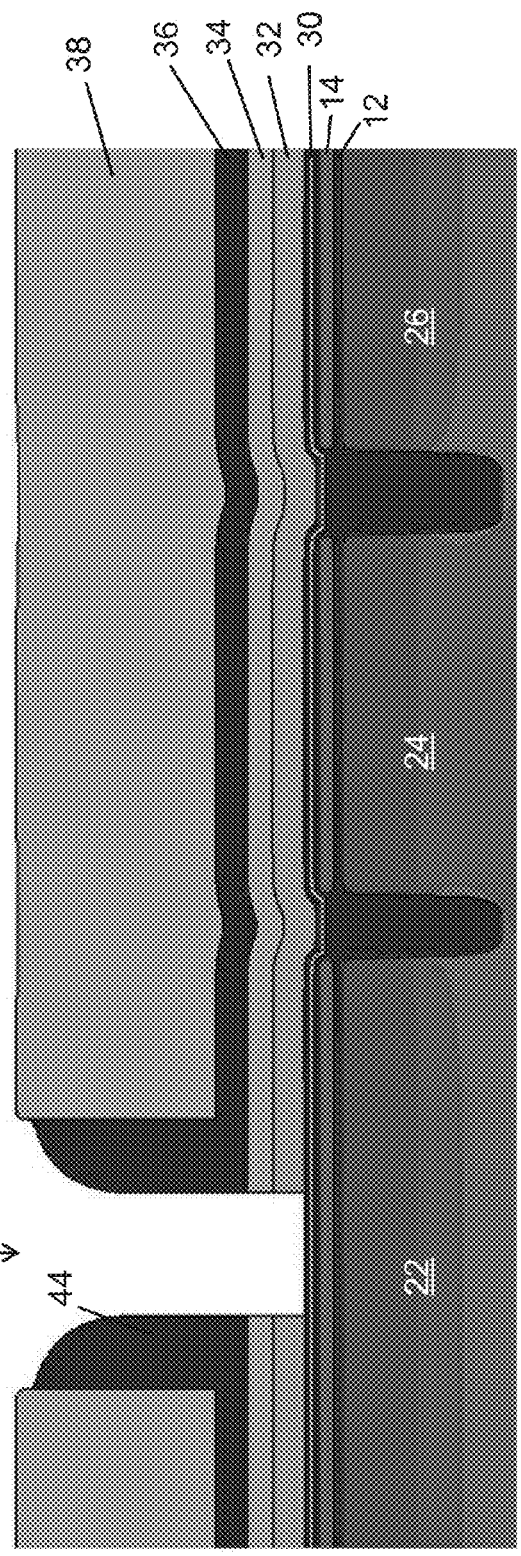

A photolithography process (photo resist, mask exposure and etch) is used to selectively expose portions of the structure in the memory cell area 22. Oxide, nitride and oxide etches are used to form trenches 42 into the exposed portions of the structure, as shown in FIGS. 5A and 5B (after photo resist removal). An oxide deposition and etch is performed to form spacers 44 of oxide along the sidewalls of the trench 42. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface). A nitride etch is used to remove the exposed portions of the nitride layer 34 at the bottom of the trenches 42 (between the spacers 44). A poly etch is then used to remove the exposed portions of the second poly layer 32 at the bottom of the trenches 42 (between the spacers 44). The resulting structure is shown FIGS. 6A and 6B.

Figure 7A:
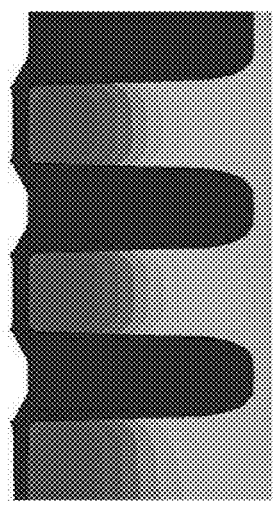
Figure 7B:
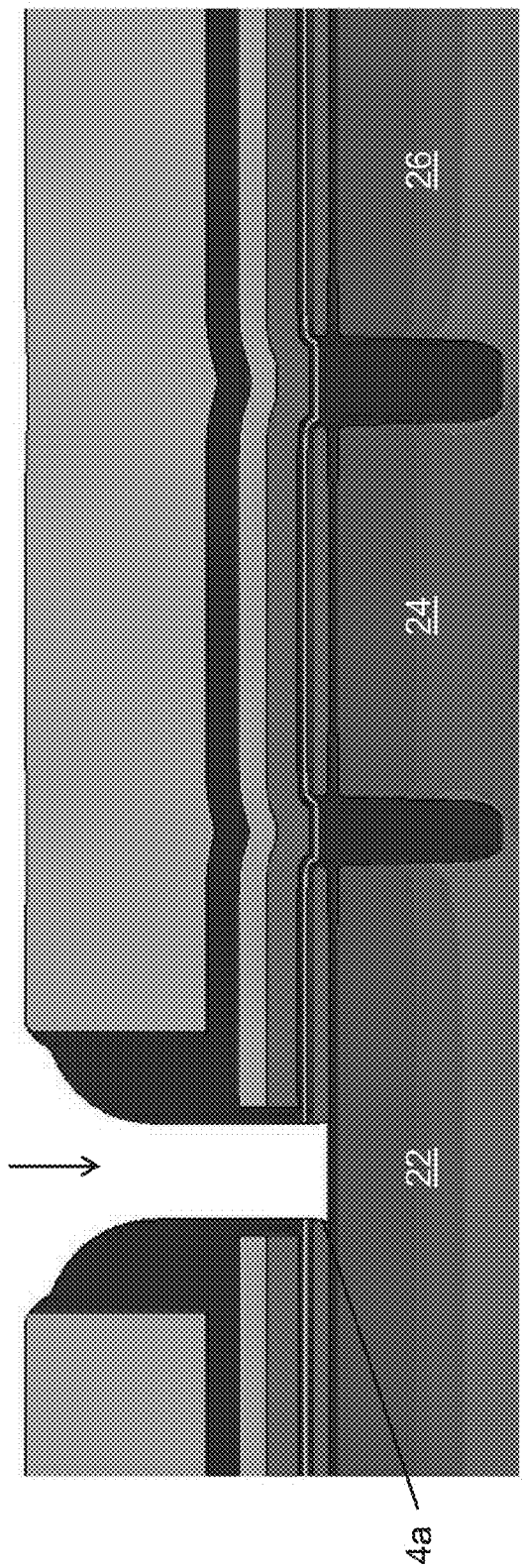
Figure 8:
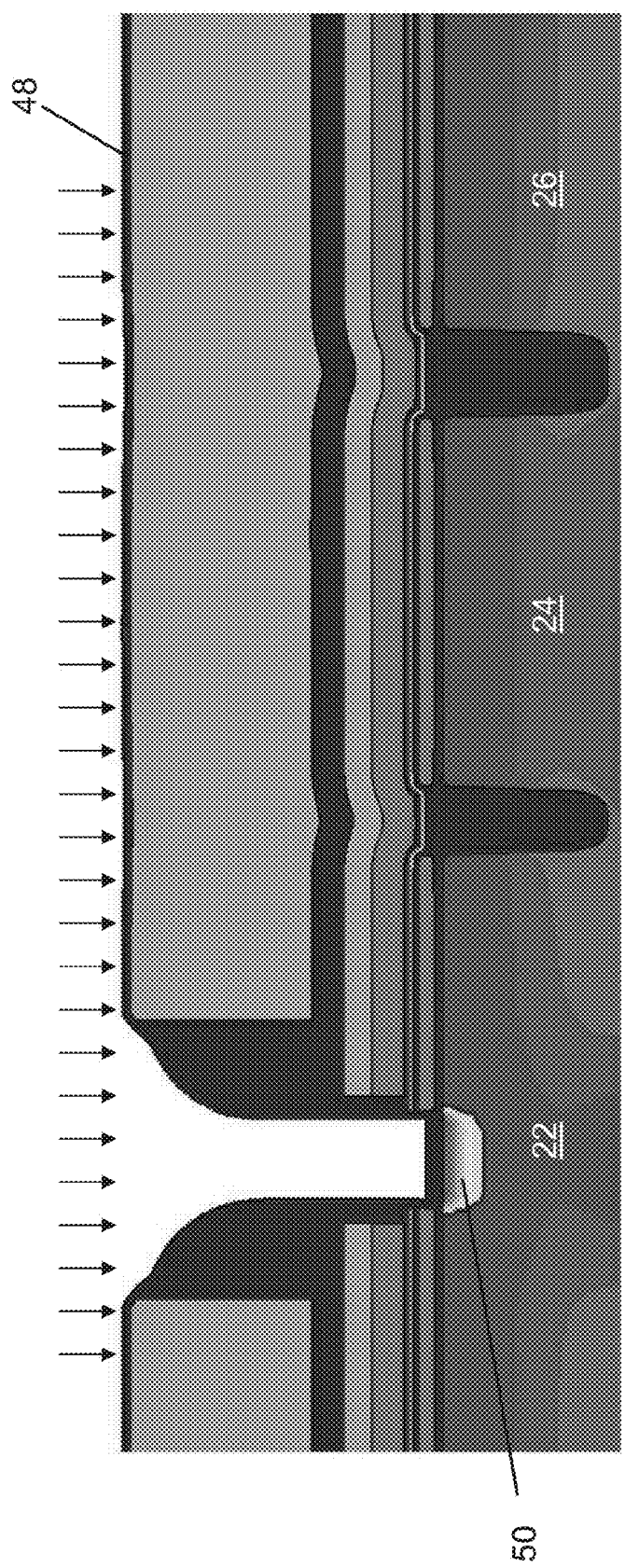
FIGS. 8-26 are side cross sectional views showing the steps in forming the memory cell device of the present invention.

An HTO (hot thermal oxide) deposition is performed to form a layer of oxide 46 on the structure (and in the trenches 42), followed by an HTO anneal. Then, oxide, ONO and poly etches are performed to extend the trenches 42 down to oxide layer 12. The poly etch is preferably isotropic, so that there is a slight undercut 14a (i.e. negative slope) to the side wall of the first poly layer 14. The resulting structure is shown in FIGS. 7A and 7B. A screening oxide layer 48 is then deposited on the structure, followed by an implant and anneal for forming source (first) regions 50 in the substrate below the trenches 42, as shown in FIG. 8.

Figure 9:
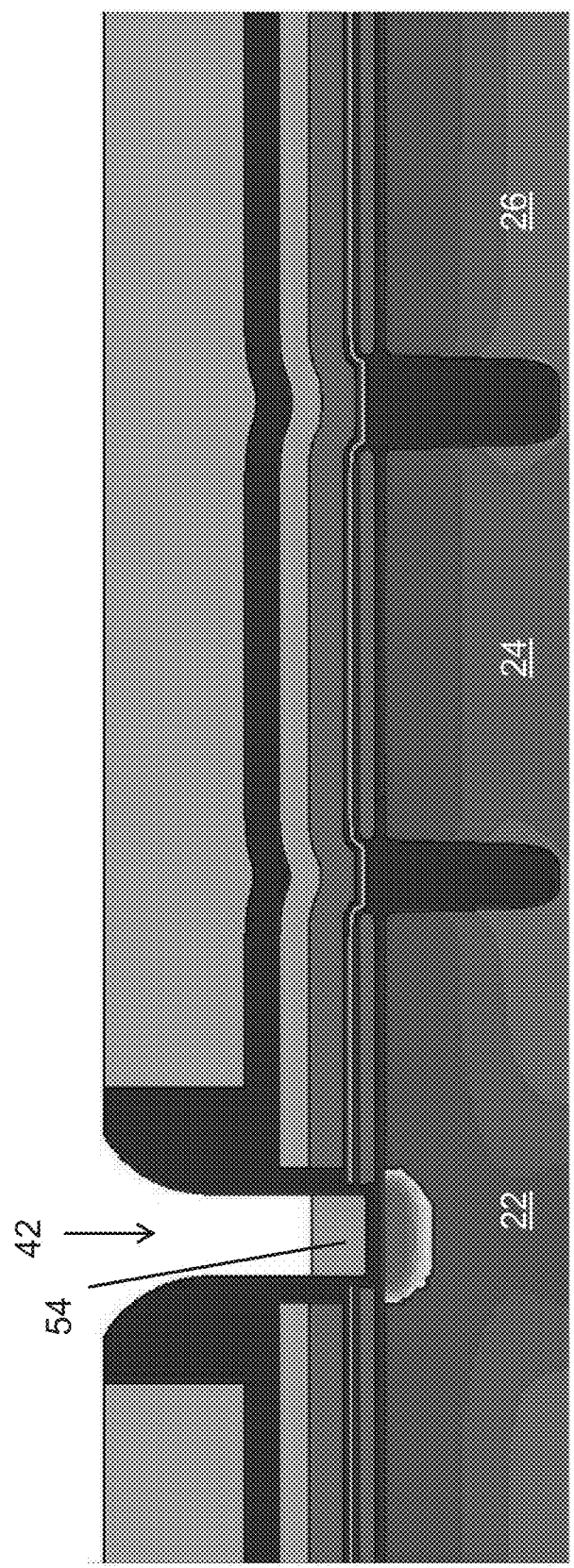
Figure 10:
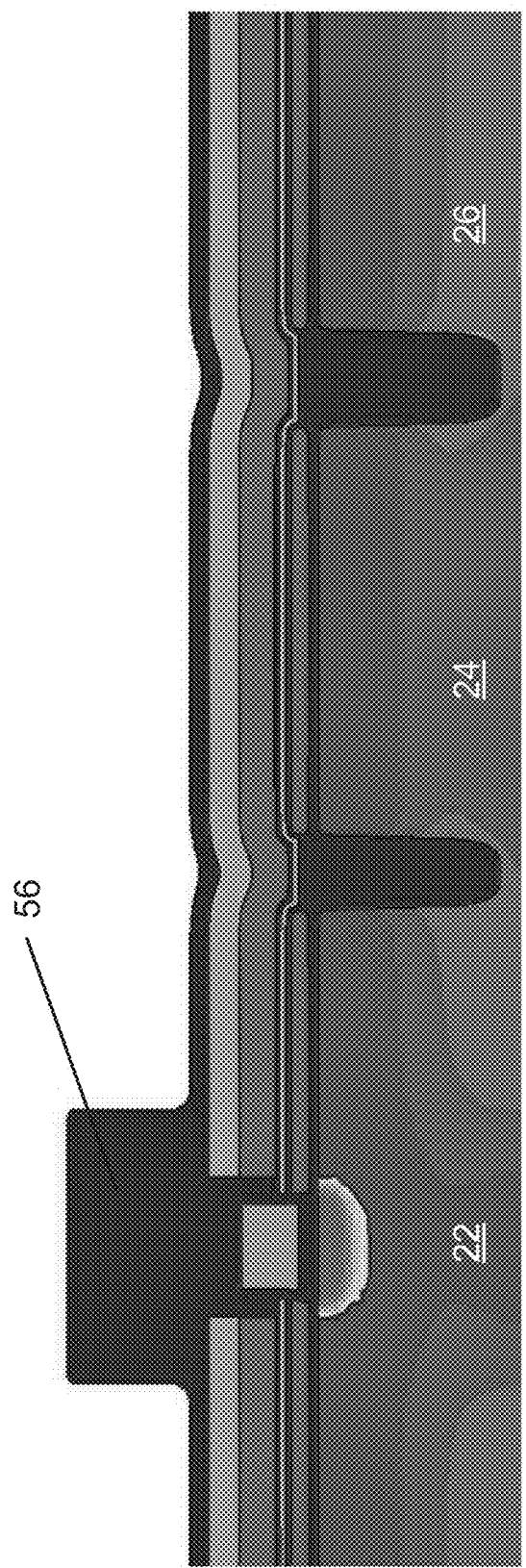

An oxide etch is performed to remove the screening oxide layer 48. An oxide deposition is then performed to form a tunnel oxide 52 at the undercut edges of the first poly layer 14. Polysilicon is then deposited on the structure, followed by a poly CMP etch back, which fills the trenches with polysilicon. A further poly etch-back leaves a block of polysilicon 54 at the bottom of each trench 42, as shown in FIG. 9. An oxide deposition and CMP oxide etch is used to fill the trenches 42 with oxide 56. A nitride etch is then used to remove the nitride layer 38, as shown in FIG. 10.

Figure 11:
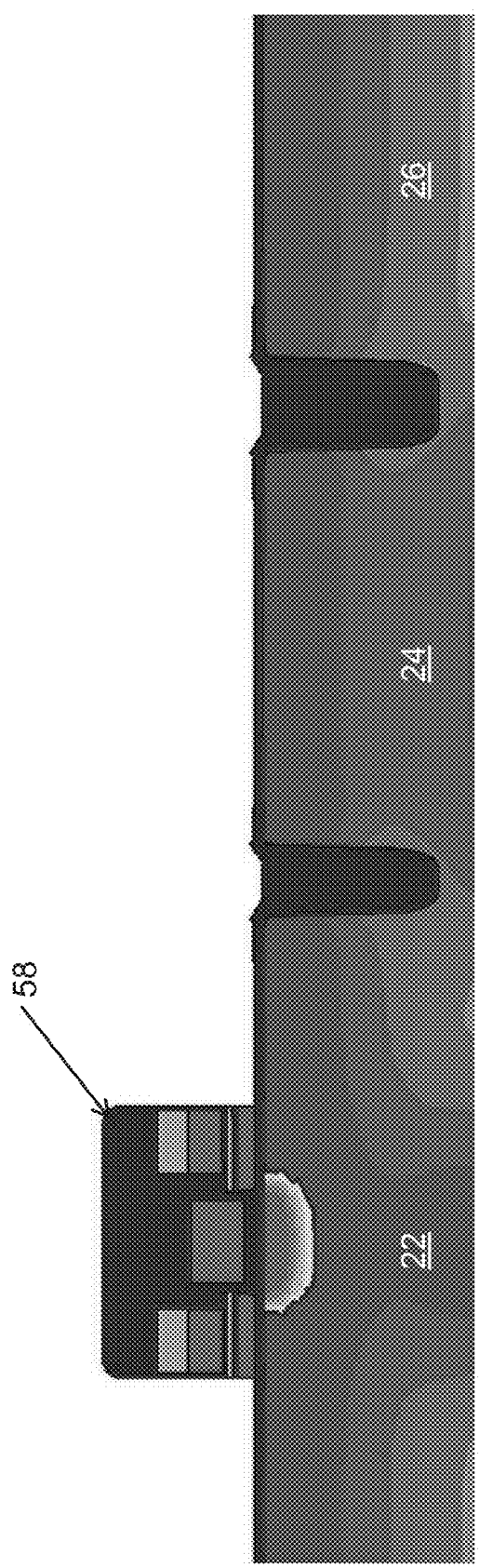

An oxide etch is performed to remove oxide layer 36 and expose the underlying nitride layer 34. A nitride etch is then used to remove the exposed portions of the nitride layer 34, followed by a poly etch to remove the exposed portions of the second poly layer 32. An HTO deposition and anneal is performed. Then, an HTO, ONO and poly etch are performed to remove the exposed portions of the ONO layer 30 and the first poly layer 14, as shown in FIG. 11, leaving a stack structure 58 that constitutes a pair of memory cells. While only a single stack structure 58 is shown, it should be appreciated that there is an array of such stack structures in the memory cell area 22.

Figure 12:
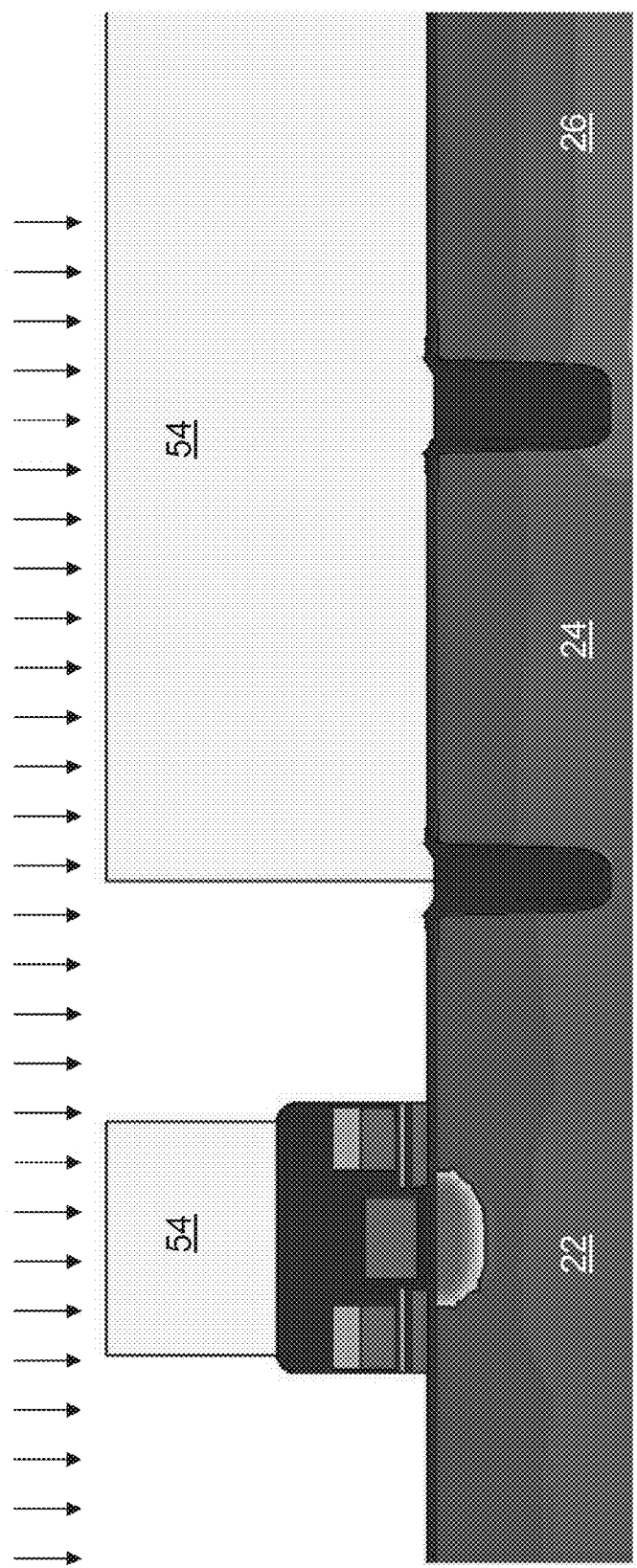
Figure 13:
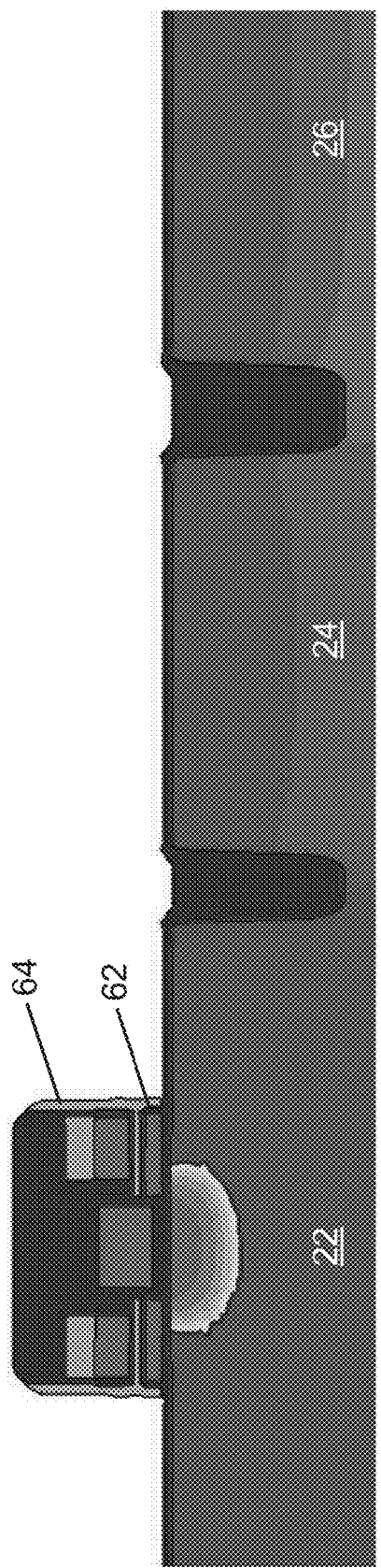

Photo resist 60 is then formed on the structure, and selectively removed from those portions in the memory cell area adjacent to each stack structure 58. An implant process is then performed on the corresponding portions of the substrate (over which the word line gates will eventually be formed), as shown in FIG. 12. After the photo resist 54 is removed, a thermal oxidation is performed to form oxide 62 on the exposed sides of the first poly layer 14. A nitride deposition and nitride etch are performed to form nitride spacers 64 on the sides of the stack structure 58, as shown in FIG. 13.

Figure 14:
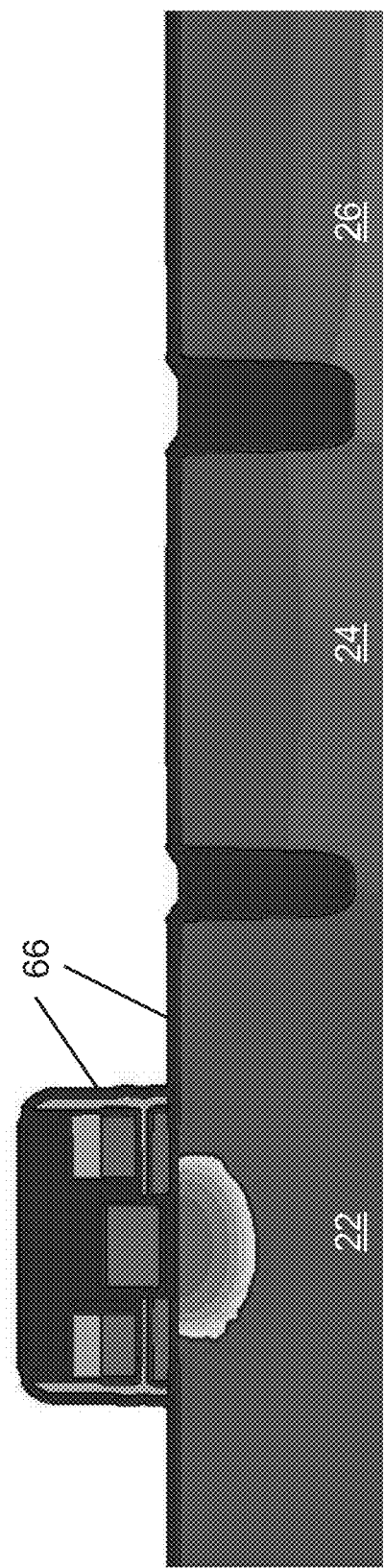

At this stage, photo resist can be formed and selectively removed to selectively expose various portions of the wafer for implantation. For example, word line implants and Vt implants in the HV/MV device area and core device area can be performed. An oxide etch is then used to remove the exposed portions of oxide layer 12 on the substrate surface. Oxide 66 (layer of oxide on substrate and spacers of oxide along stack structure sidewalls) is then formed on the structure by RTO and HTO, followed by HTO anneal, as shown in FIG. 14.

Figure 15:
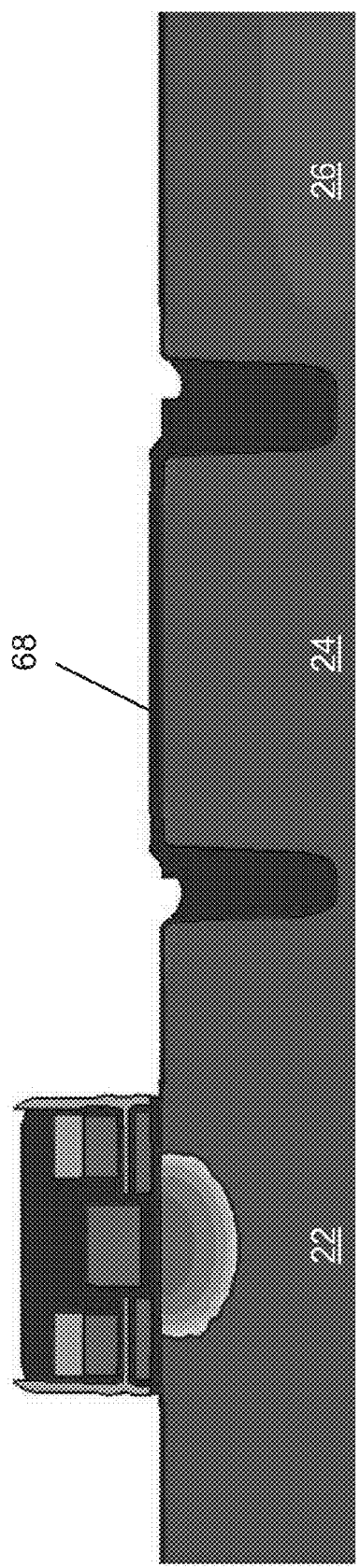

At this stage, photo resist can be formed and selectively removed to selectively expose various portions of the wafer for further implantation. For example, P-well and N-well implants can be performed in the core device area as needed. Photo resist is then formed over the memory cell area 22 and core device area 26, leaving the HV/MV device area 24 exposed. An oxide etch is used to remove the oxide 66 on the substrate surface in the HV/MV device area 24, followed by an oxidation process to form a thicker oxide layer 68. After the photo resist is removed, additional photo resist is formed over the HV/MV device area 24, leaving the memory cell area 22 and core device area 26 exposed to an oxide etch that removes the oxide layer 66 on the substrate surface, the oxide spacers 66 along the memory cell area structure 58, and the oxide along the top surface of the memory cell area structure, as shown in FIG. 15 (after the photo resist is removed).

Figure 16:
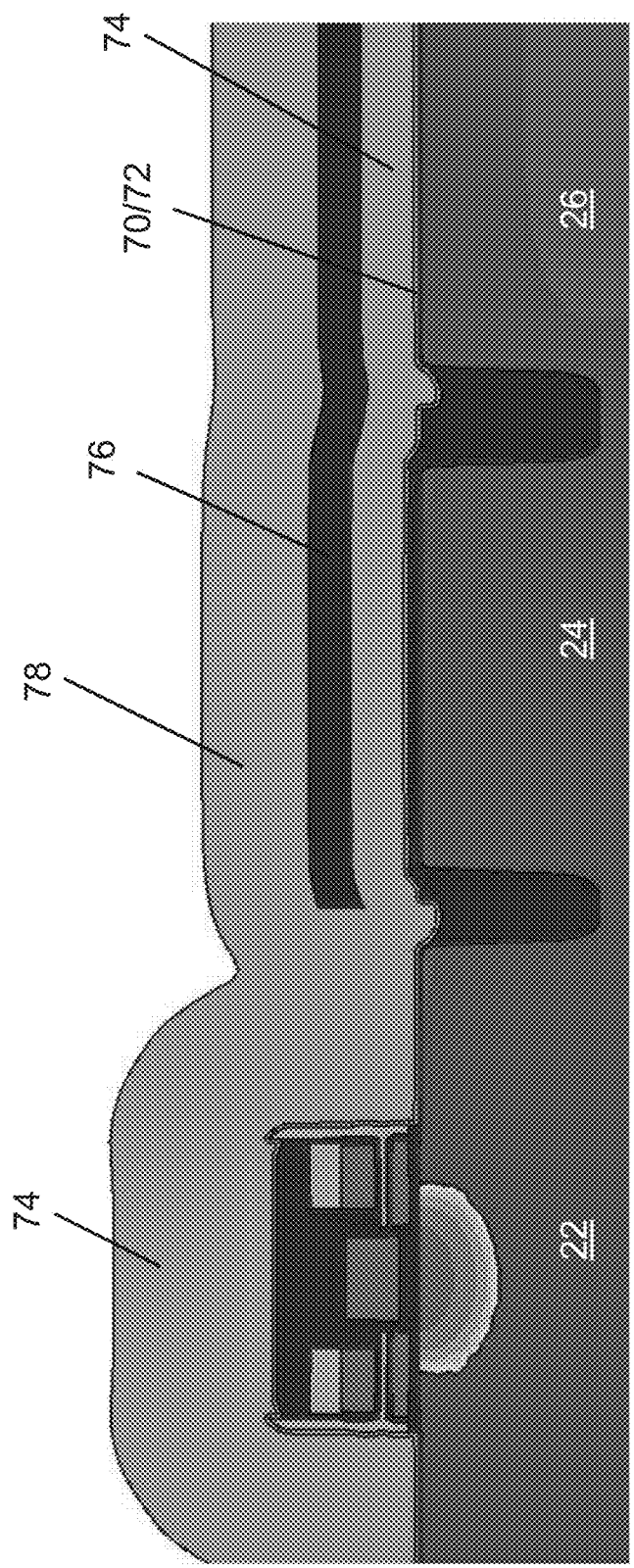

A layer of high-K insulation material 70 is formed over the structure, followed by the formation of a TiN layer 72, a third layer of poly silicon 74, and an oxide layer 76. The oxide layer is patterned using photolithography to remove the oxide layer 76 from the memory cell area 22, but leave it intact in the HV/MV device 24 and core device areas 26. Another poly deposition is then performed to thicken the poly 74 in the memory cell area 22, and to form polysilicon layer 78 over the oxide layer 76 in the HV/MV device and core device areas, as shown in FIG. 16.

Figure 17:
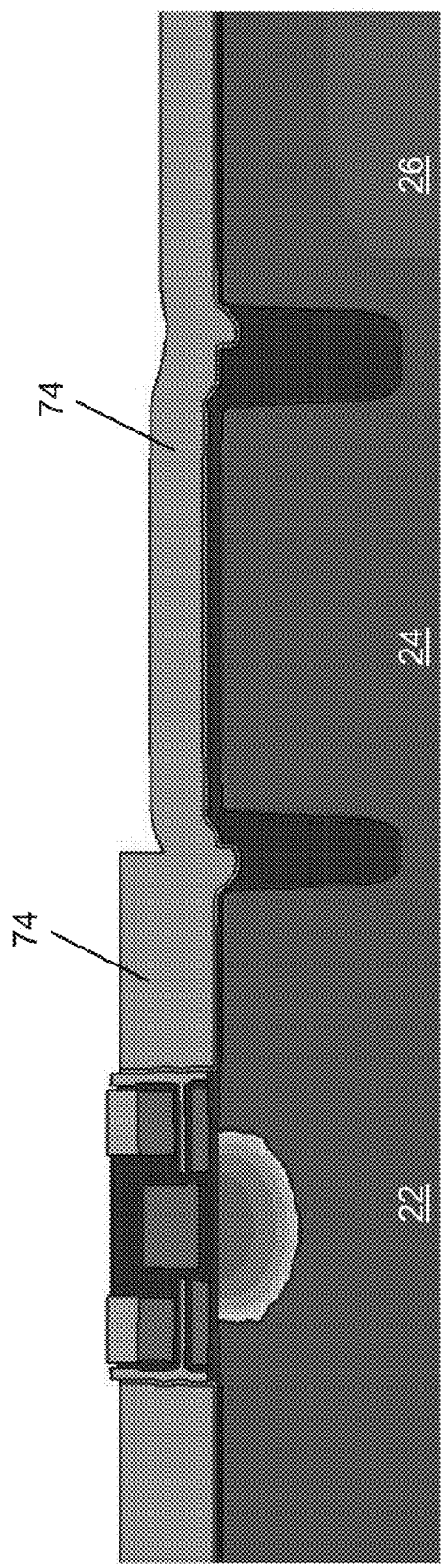
Figure 18:
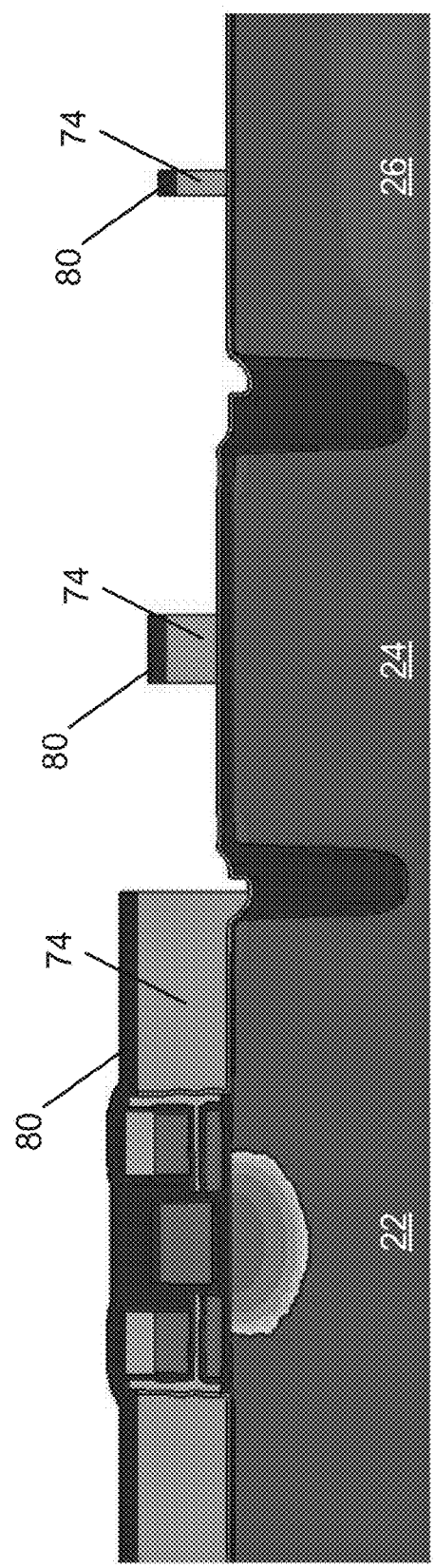

After a BARC coating, a poly etch is performed to thin the poly layer 74 and remove poly layer 78. Then, the oxide layer 76 is removed by an oxide etch, leaving poly layer 74 with a larger thickness in the memory cell area 22 relative to the thickness thereof in the HV/MV device and core device areas 24/26, as shown in FIG. 17. An oxide layer 80 is formed over the structure, which is patterned by photolithography to selectively expose portions of the underlying poly 74. A poly etch is performed on the exposed poly portions leaving blocks of the poly 74 in the various areas, as shown in FIG. 18 (after the removal of the photolithography photo resist).

Figure 19:
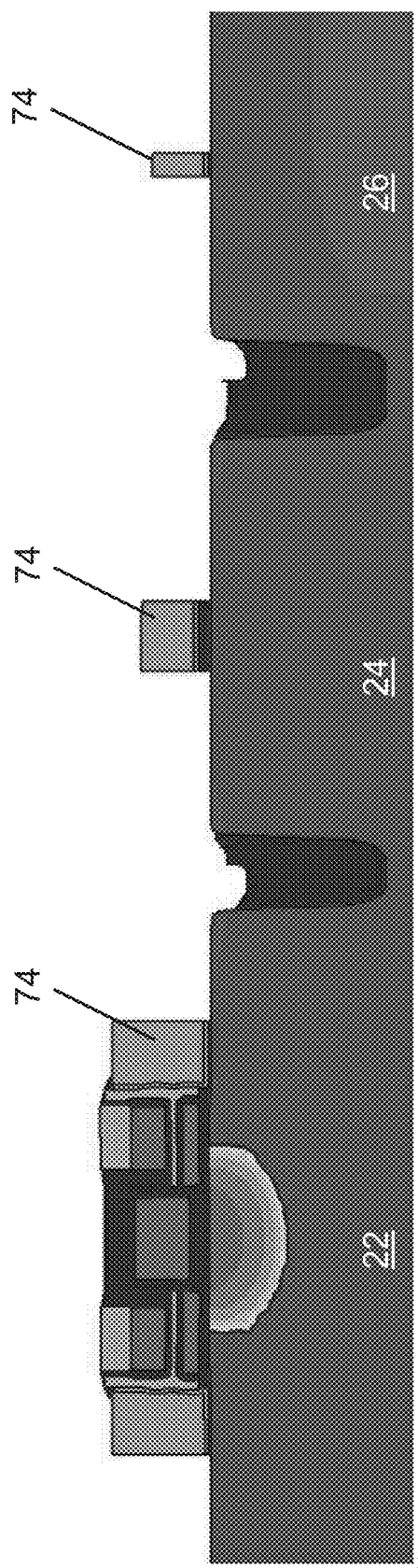

The oxide layer 80 is again patterned using photolithography (i.e. photo resist deposition, mask exposure, poly etch, oxide etch), to remove portions of the oxide layer 80 in the memory cell area, leaving underlying portions of the poly blocks 74 exposed. After photo resist removal, a poly etch is then performed to remove those exposed portions of poly blocks 74 (i.e. to reduce the width of the poly blocks 74 in the memory cell area 22). A TiN etch is then performed to remove the exposed portions of the TiN layer 72. An oxide etch is then performed which removes the oxide layer 80 over the poly blocks 74, and removes the high K insulator 70 on the substrate surface. The resulting structure is shown in FIG. 19.

Figure 20:
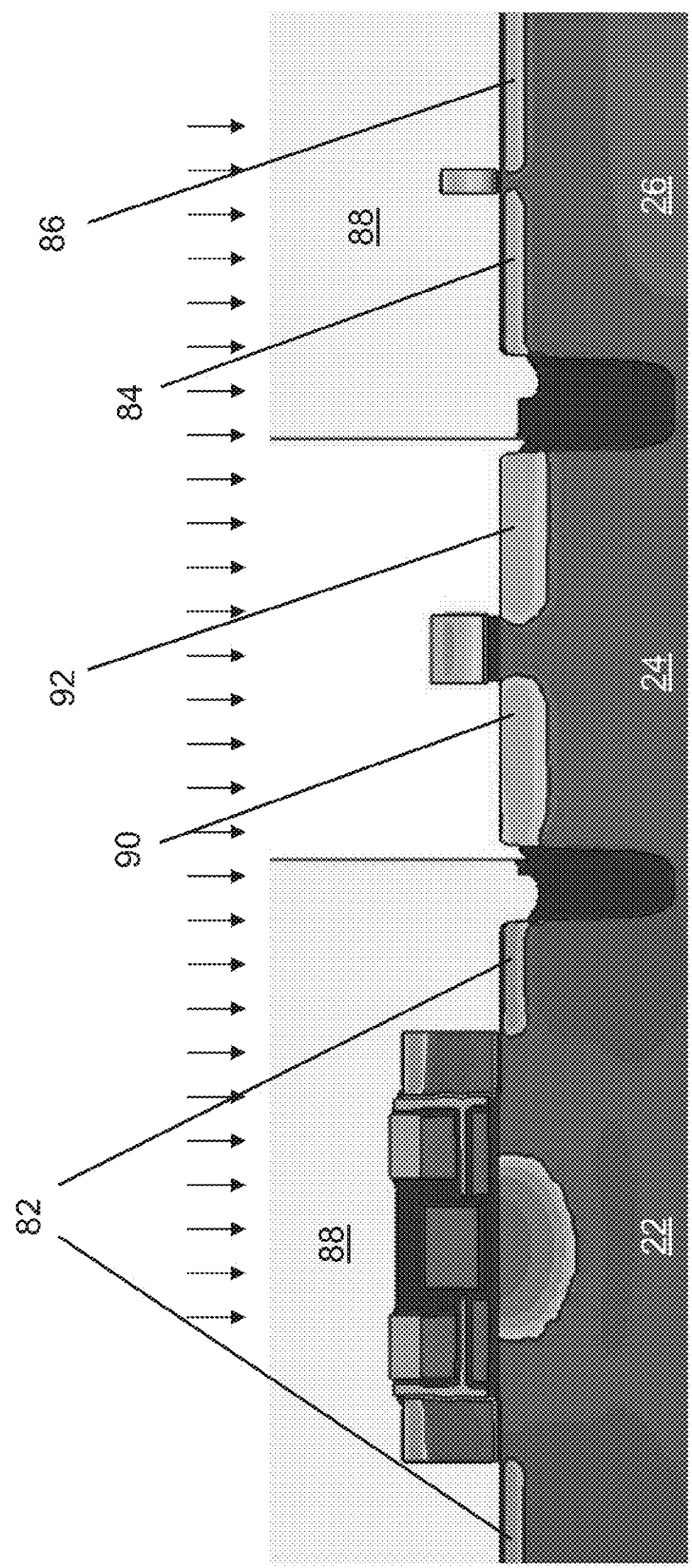

An oxidation process is used to form a layer of oxide on the exposed surface portions of the substrate. A series of implants are then performed to form the source/drain regions in the various areas. For example, photo resist is formed over the structure, and removed only from the memory cell area 22. Then, an LDD implant is performed to form the drain regions 82. After photo resist removal, additional photo resist is formed over the structure, and removed only from the core device area 26. Then, an implant is performed to form the source and drain regions 84 and 86 in the core device area 26. An oxide etch is then performed to remove the oxide layer on the substrate surface in the core device area 26. After photo resist removal, additional photo resist 88 is formed over the structure, and removed only from the HV/MV device area 24. Then, a high voltage implant is performed to form the source and drain regions 90 and 92 in the HV/MV device area 24, as shown in FIG. 20 (after an oxide etch is used to remove the oxide layer on the substrate surface in the HV/MV device area 24). By separating the implantations, the various source/drain regions in the three areas can be formed with different breakdown voltages, and accommodates the formation of the various areas in wells of different conductivity type (i.e. P-well versus N-well).

Figure 21:
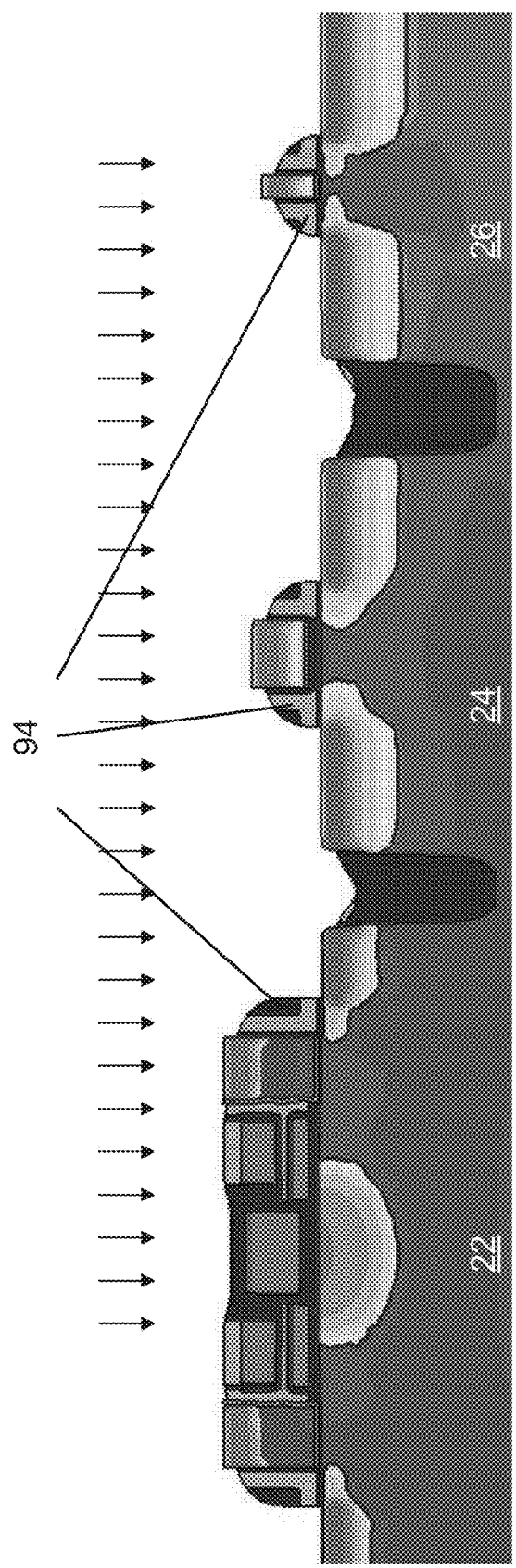
Figure 22:
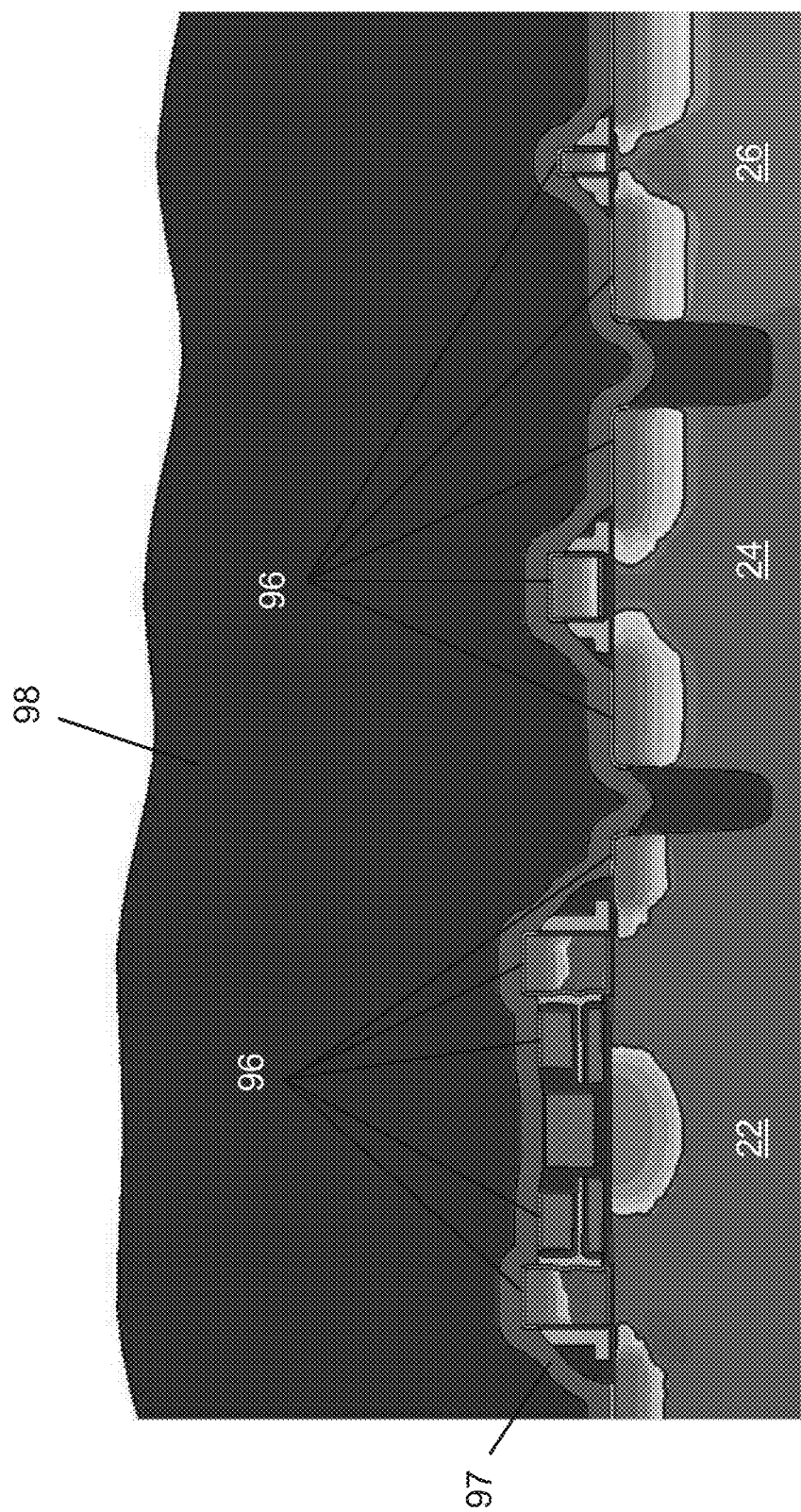

After photo resist removal, oxide and nitride depositions and etch back are performed to form oxide/nitride spacers 94 along the sidewalls of the structures. Additional implants can be performed to complete the source/drain region formation, where the spacers block this implantation such that graded junctions results, as shown in FIG. 21. Photoresist is formed over the structure and selectively removed via photolithography to selectively expose the structures in the memory cell area 22. An oxide etch is then performed to remove the oxide on the poly blocks in the memory cell area 22. After photo resist removal, silicide 96 is formed on the exposed top surfaces of the poly blocks and the exposed upper surface of the substrate. Insulation materials 97 (e.g. oxide) and 98 (e.g. ILDO—interlayer dielectric) are then formed over the structure. The resulting structure is shown in FIG. 22.

Figure 23:
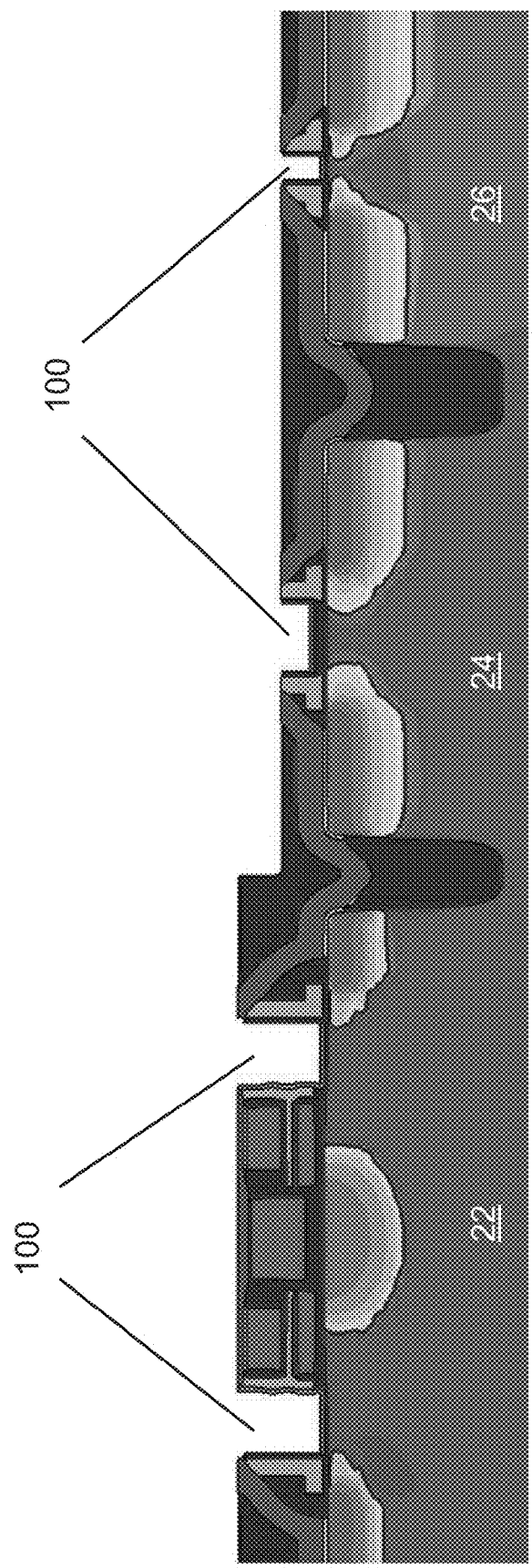
Figure 24:
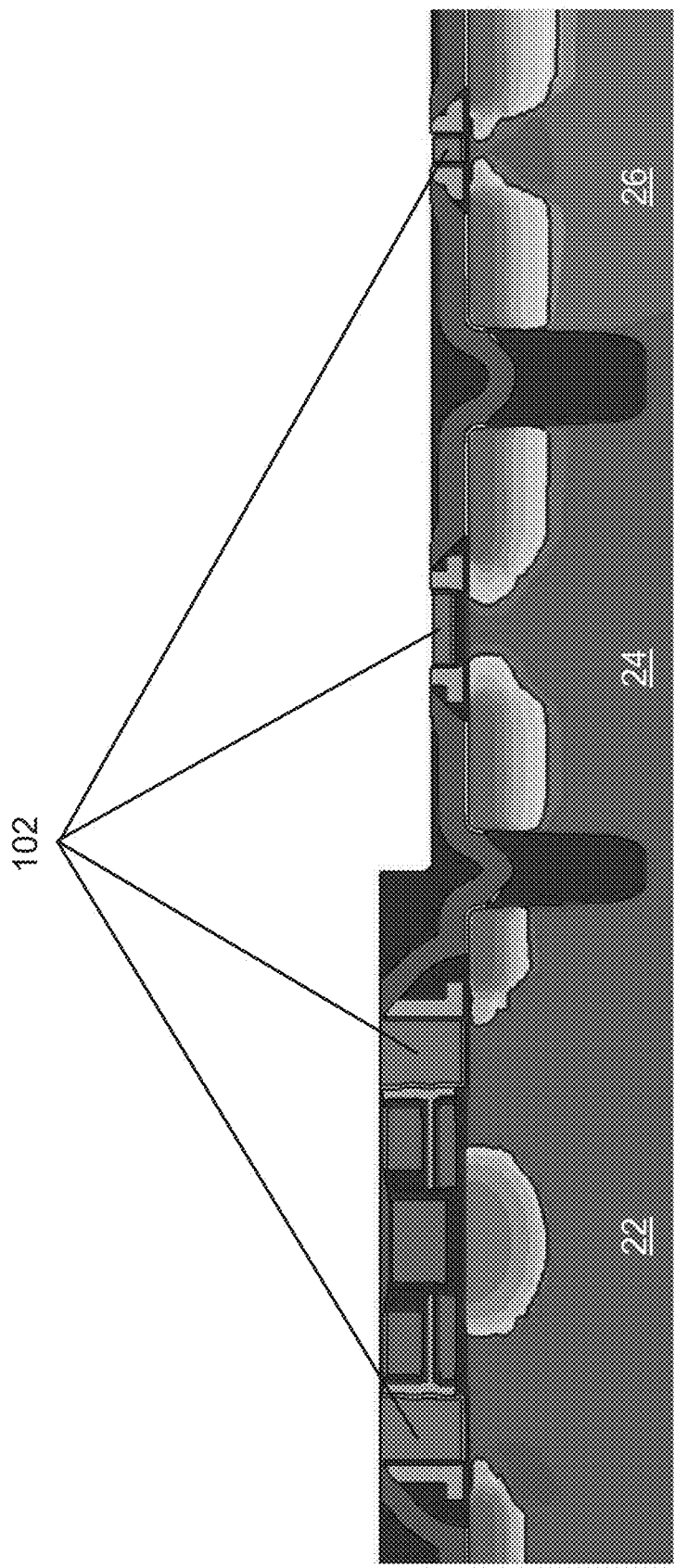

ILDO etches are performed to expose the poly blocks 74 in the HV/MV device and core device areas 24/26, and to expose the outer poly blocks 74 for each stack structure 58 in the memory cell area 22. Patterned photo resist can be used to protect the memory cell area for additional ILDO etching in the HV/MV device and core device areas to reach the poly blocks 74 in those areas. The exposed poly blocks 74 are then removed by a poly etch, leaving trenches 100 as shown in FIG. 23. The trenches 100 are filled with blocks of metal material 102 by metal deposition and etch back (i.e., forming metal gates for the logic devices and memory cells). The metal deposition and etch back can be performed separately for the different areas using protective photo resist for the other areas. The resulting structure is shown in FIG. 24.

Figure 25:
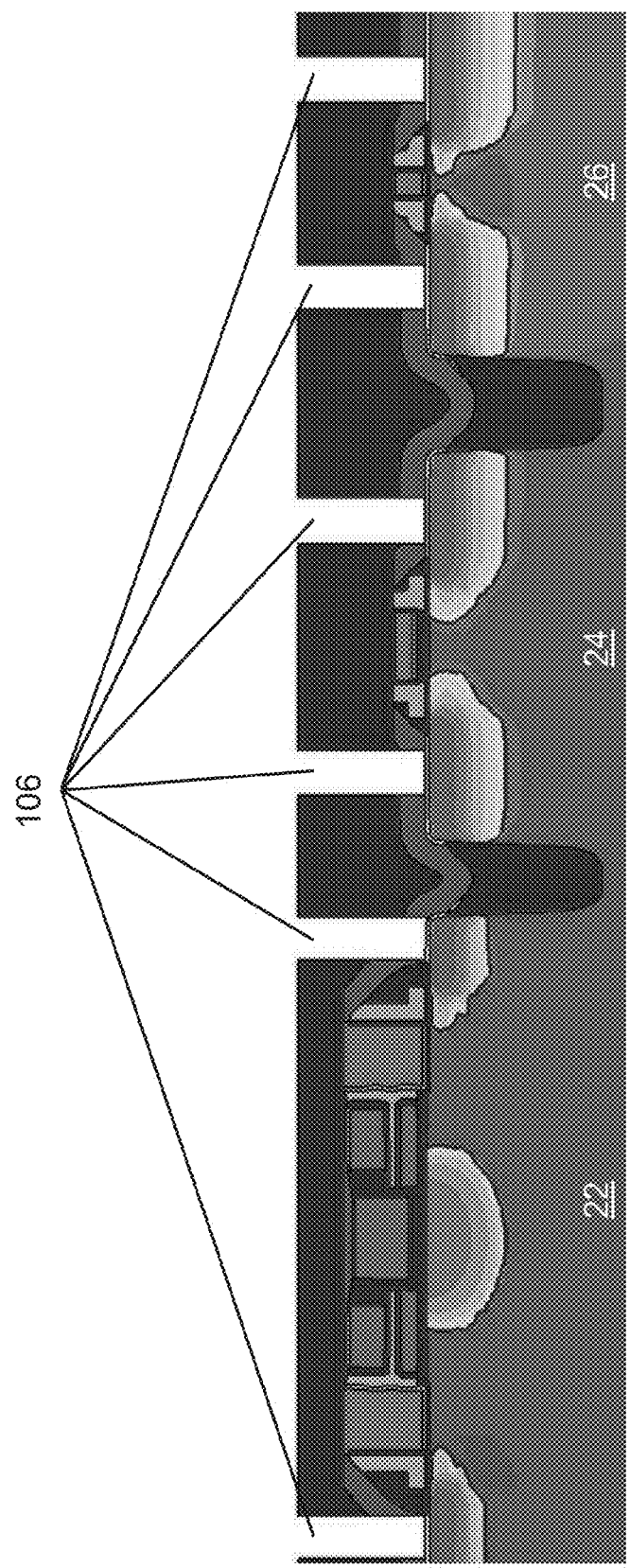
Figure 26:
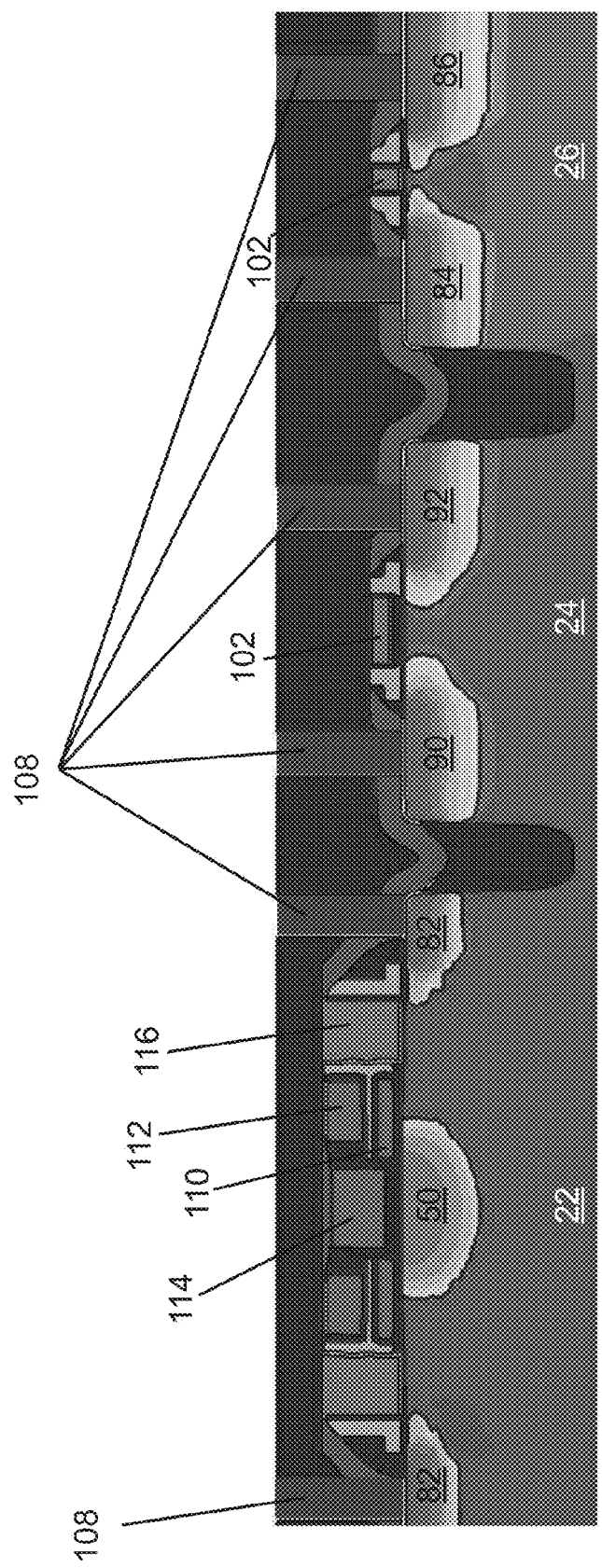

Insulation material 104 (e.g. ILDO) is then formed over the structure and planarized using a CMP etch. Photo resist is then formed on the structure and patterned by photo lithography to selectively expose the insulation material. A etch is then used to remove the exposed portions of the insulation material, to create contact holes 106 through the insulation material 104 down to and exposing the source and drain regions, as shown in FIG. 25 (after photo resist removal). The contact holes 106 are then filled with an appropriate conductive material to create electrical contacts 108 for the source/drain regions. The final structure is shown in FIG. 26.

The memory cells each include source and drain regions 50 and 82, polysilicon floating gate 110, polysilicon control (coupling) gate 112, polysilicon erase gate 114, and a metal word line or select gate 116. The memory cells are formed in pairs, sharing a common erase gate 114 and common source region 50. Each logic device in the HV/MV device area 24 includes source and drain regions 90/92, and a metal gate 102. Each logic device in the core device area 26 includes source and drain regions 84/86, and a metal gate 102.

The above describe formation process has many advantages. First, the memory cells and logic devices are fully formed in a self-aligned process before their poly gates are removed and replaced with metal material. The memory cell components, especially the floating gate, control gate, the erase gate and the tunnel oxide between the floating and erase gates, are formed first and protected by insulation material from the later implemented metal gate formation processing. The sides of the floating gate are formed by separate processing steps, so that the floating gate sidewall over the source region can be formed with a slight undercut to enhance the sharp edge facing the erase gate, while the floating gate sidewall adjacent the select gate is formed with a vertical orientation. Many elements are self-aligned to each other, which reduces the number of required photolithography masking steps.

Figure 27:
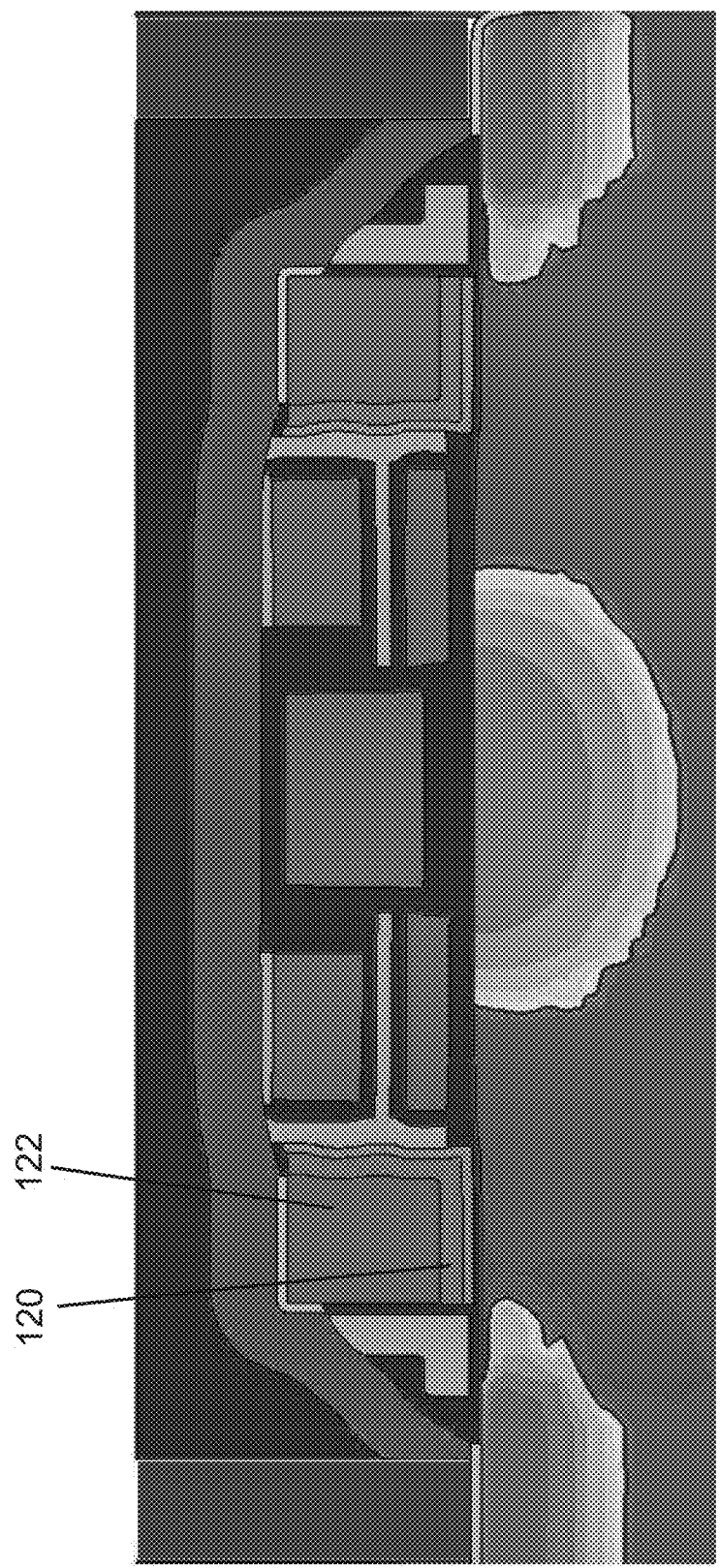
FIG. 27 is a side cross sectional view showing an alternate embodiment of the memory cell device of the present invention.

It is to be understood that the present invention is not limited to the embodiment(s) described above and illustrated herein. For example, references to the present invention herein are not intended to limit the scope of any claims or claim terms, but instead merely make reference to one or more features that may be covered by one or more claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the pairs of memory cells and associated logic devices. Single layers of material could be formed as multiple layers of such or similar materials, and vice versa. Lastly, the metal select gates 116 could be made of a composite of conductive materials. For example, instead of being made of a block of solid metal, the select gates 116 could instead be formed of L-shaped metal material 120, and a block of polysilicon 122, as shown in FIG. 27. As another example, the select gates 116 can remain polysilicon (i.e. outer poly blocks 74 in memory cell area 22 shown in FIG. 22 are not removed and replaced with metal blocks as shown in FIGS. 23-24).

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a memory device, comprising:
forming, in a substrate of a first conductivity type, spaced apart first and second regions of a second conductivity type, defining a channel region therebetween;
forming a floating gate disposed over and insulated from a first portion of the channel region which is adjacent the first region;
forming a control gate disposed over and insulated from the floating gate;
forming an erase gate disposed over and insulated from the first region;
forming a select gate over and insulated from a second portion of the channel region which is adjacent to the second region;
wherein the forming of the floating gate includes:
   forming a first insulation layer on the substrate,
   forming a first conductive layer on the first insulation layer,
   performing a first etch to form a first trench through the first conductive layer, and
   performing a second etch different than the first etch to form a second trench through the first conductive layer,
   wherein the floating gate constitutes the first conductive layer between the first and second trenches,
   wherein the first region is disposed under the first trench,
   wherein a sidewall of the first conductive layer at the first trench has a negative slope, and wherein a sidewall of the first conductive layer at the second trench is vertical.

2. The method of claim 1, wherein the forming of the select gate includes depositing a polysilicon layer over and insulated from the substrate, and etching through the polysilicon layer leaving a first block of the polysilicon layer laterally adjacent to and insulated from the floating gate and the control gate.

3. The method of claim 2, further comprising forming a first logic device on the substrate by:
forming a first logic gate over and insulated from the substrate;
forming in the substrate spaced apart third and fourth regions of the second conductivity type, defining a second channel region therebetween;
wherein the first logic gate is disposed over the second channel region and is formed by:
   etching through the polysilicon layer leaving a second block of the polysilicon layer,
   removing and replacing the second block of the polysilicon layer with a first block of metal material that constitutes the first logic gate.

4. The method of claim 3, further comprising forming a second logic device on the substrate by:
forming a second logic gate over and insulated from the substrate;
forming in the substrate spaced apart fifth and sixth regions of the second conductivity type, defining a third channel region therebetween;
wherein the second logic gate is disposed over the third channel region and is formed by
   etching through the polysilicon layer leaving a third block of the polysilicon layer;
   removing and replacing the third block of the polysilicon layer with a second block of metal material that constitutes the second logic gate.

5. The method of claim 4, wherein:
the first logic gate is insulated from the substrate by a second insulation layer;
the second logic gate is insulated from the substrate by a third insulation layer;
the second insulation layer is thicker than the third insulation layer.

6. The method of claim 4, wherein the first and second logic gates each have a height lower than a height of select gate.

7. A method of forming a memory device, comprising:
forming, in a substrate of a first conductivity type, spaced apart first and second regions of a second conductivity type, defining a channel region therebetween;
forming a floating gate disposed over and insulated from a first portion of the channel region which is adjacent the first region;
forming a control gate disposed over and insulated from the floating gate;
forming an erase gate disposed over and insulated from the first region;
forming a select gate over and insulated from a second portion of the channel region which is adjacent to the second region;
wherein the forming of the floating gate includes depositing a first polysilicon layer over and insulated from the substrate, and etching through the first polysilicon layer leaving a block of the first polysilicon layer that constitutes the floating gate;
wherein the forming of the control gate includes depositing a second polysilicon layer over and insulated from the first polysilicon layer, and etching through the second polysilicon layer leaving a block of the second polysilicon layer that constitutes the control gate;
wherein the forming of the erase gate includes depositing a third polysilicon layer over and insulated from the first region;
wherein the forming of the select gate includes depositing a fourth polysilicon layer over and insulated from the substrate, and etching through the fourth polysilicon layer leaving a first block of the fourth polysilicon layer laterally adjacent to and insulated from the floating gate and the control gate.

8. The method of claim 7, wherein the first block of the fourth polysilicon layer constitutes the select gate.

9. The method of claim 7, wherein the forming of the select gate further comprises:
removing and replacing the first block of the fourth polysilicon layer with a first block of metal material which constitutes the select gate.

10. The method of claim 7, further comprising forming a first logic device on the substrate by:
forming a first logic gate over and insulated from the substrate;
forming in the substrate spaced apart third and fourth regions of the second conductivity type, defining a second channel region therebetween;
wherein the first logic gate is disposed over the second channel region and is formed by:
   etching through the fourth polysilicon layer leaving a second block of the fourth polysilicon layer, removing and replacing the second block of the fourth polysilicon layer with a first block of metal material that constitutes the first logic gate.

11. The method of claim 10, further comprising forming a second logic device on the substrate by:
  forming a second logic gate over and insulated from the substrate;
  forming in the substrate spaced apart fifth and sixth regions of the second conductivity type, defining a third channel region therebetween;
  wherein the second logic gate is disposed over the third channel region and is formed by:
    etching through the fourth polysilicon layer leaving a third block of the fourth polysilicon layer,
    removing and replacing the third block of the fourth polysilicon layer with a second block of metal material that constitutes the second logic gate.

12. The method of claim 11, wherein:
the first logic gate is insulated from the substrate by a first insulation layer;
the second logic gate is insulated from the substrate by a second insulation layer;
the first insulation layer is thicker than the second insulation layer.

13. The method of claim 11, wherein the first and second logic gates each have a height lower than a height of select gate.

* * * * *